United States Patent
Kimball

(10) Patent No.: US 10,690,730 B2
(45) Date of Patent: Jun. 23, 2020

(54) APPARATUS AND METHOD FOR REDUCING OFFSETS AND 1/F NOISE

(71) Applicant: CIRRUS LOGIC INTERNATIONAL SEMICONDUCTOR LTD., Edingburgh (GB)

(72) Inventor: Eric Kimball, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 215 days.

(21) Appl. No.: 16/003,078

(22) Filed: Jun. 7, 2018

(65) Prior Publication Data
US 2019/0377034 A1 Dec. 12, 2019

(51) Int. Cl.
*H03M 1/00* (2006.01)
*G01R 33/00* (2006.01)
*H03M 3/00* (2006.01)
*G01R 33/07* (2006.01)

(52) U.S. Cl.
CPC ......... *G01R 33/0029* (2013.01); *G01R 33/07* (2013.01); *H03M 3/356* (2013.01); *H03M 3/368* (2013.01); *H03M 3/42* (2013.01)

(58) Field of Classification Search
CPC .. G01R 33/0029; G01R 33/07; G01R 33/075; H03M 3/368; H03M 3/42; H03M 3/356
USPC ........................................ 341/126, 143, 155
See application file for complete search history.

(56) References Cited

U.S. PATENT DOCUMENTS

| | | | | |
|---|---|---|---|---|
| 5,016,280 A | * | 5/1991 | Engebretson | H03H 21/0012 381/320 |
| 5,479,130 A | | 12/1995 | McCartney | |
| 5,491,623 A | * | 2/1996 | Jansen | H02M 3/07 327/536 |
| 5,617,058 A | * | 4/1997 | Adrian | H03F 1/3264 330/10 |
| 5,727,037 A | * | 3/1998 | Maneatis | H03L 7/0812 375/374 |
| 6,476,671 B1 | | 11/2002 | Tang | |

(Continued)

OTHER PUBLICATIONS

Wikipedia, "Noise Shaping" Downloaded on May 24, 2018 from https://en.wikipedia.org/wiki/noise_shaping pp. 1-4.

(Continued)

*Primary Examiner* — Jean B Jeanglaude
(74) *Attorney, Agent, or Firm* — E. Alan Davis; James W. Huffman

(57) ABSTRACT

Switching circuits controllable to force an input into a circuit and to sense a responsively produced output in multiple ways to produce different combinations of positive and negative polarities of a desired signal and of sources of offsets and 1/f noise. The switching circuits are controlled in a non-ordered time sequence of different combinations of positive and negative polarities of the sources of the offsets and 1/f noise that spreads their energy to a frequency range above the desired signal frequency band. The non-ordered time sequence leaves the polarity of the desired signal unchanged. Uncorrelated delta-sigma modulators may generate the control signal. A DSP processes a resulting spectrum of a digital domain version of the sensed output to measure residual offsets and 1/f noise and adds to an input present at the DSMs a signal equal in magnitude and opposite in sign to the measured residual offsets and 1/f noise.

20 Claims, 8 Drawing Sheets

(56) References Cited

U.S. PATENT DOCUMENTS

| | | | | |
|---|---|---|---|---|
| 6,700,518 B2* | 3/2004 | Kishida | ............... | H03F 3/217 |
| | | | | 341/143 |
| 7,129,714 B2* | 10/2006 | Baxter | ............... | G01D 5/24 |
| | | | | 324/678 |
| 7,295,077 B2* | 11/2007 | Thomsen | ............... | H03L 7/0898 |
| | | | | 327/105 |
| 7,894,789 B2* | 2/2011 | Sorrells | ............... | H03C 3/40 |
| | | | | 375/328 |
| 9,225,368 B2* | 12/2015 | Nienaber | ............ | H04B 1/0003 |
| 9,401,725 B2* | 7/2016 | Lenz | ............... | H03M 1/0607 |

OTHER PUBLICATIONS

Mosser, Vincent et al. "A Spinning Current Circuit for Hall Measurements Down to the Nanotesla Range." *IEEE Transactions on Instrumentation and Measurement*. vol. 66, No. 4, Apr. 2017. pp. 637-650.

\* cited by examiner

| config | Contact name | | | | At PA input | | | |
|---|---|---|---|---|---|---|---|---|
| | I+ | I- | V+ | V- | Hall signal | Hall offset and 1/f noise | PA offset and 1/f noise | Pickup and emf |
| 1 | a+ | a- | b+ | b- | + | + | + | + |
| 2 | b+ | b- | a- | a+ | + | - | + | - |
| 3 | a- | a+ | b- | b+ | + | + | + | - |
| 4 | b- | b+ | a+ | a- | + | - | + | + |
| 5 | a+ | a- | b- | b+ | - | + | + | - |
| 6 | b+ | b- | a+ | a- | - | - | + | + |
| 7 | a- | a+ | b+ | b- | - | + | + | + |
| 8 | b- | b+ | a- | a+ | - | - | + | - |

| config | Contact name | | | | At PA input | | | | Demod | After demodulation | | | |
|---|---|---|---|---|---|---|---|---|---|---|---|---|---|
| | I+ | I- | V+ | V- | Hall signal | Hall offset and 1/f noise | PA offset and 1/f noise | Pickup and emf | Demod sign | Hall signal | Hall offset and 1/f noise | PA offset and 1/f noise | Pickup and emf |
| 3 | a- | a+ | b- | b+ | + | + | + | - | +1 | + | + | + | - |
| 4 | b- | b+ | a+ | a- | + | - | + | + | +1 | + | - | + | + |
| 5 | a+ | a- | b- | b+ | - | - | + | - | -1 | + | + | - | + |
| 6 | b+ | b- | a+ | a- | - | + | + | + | -1 | + | - | - | - |

FIG. 7

| DSM2 | DSM1 | config | I+ | I- | V+ | V- | Hall signal | Hall offset and 1/f noise | PA offset and 1/f noise | Pickup and emf | Demod sign | Hall signal | Hall offset and 1/f noise | PA offset and 1/f noise | Pickup and emf |
|---|---|---|---|---|---|---|---|---|---|---|---|---|---|---|---|
| 0 | 0 | 3 | a- | a+ | b- | b+ | + | + | + | - | +1 | + | + | + | - |
| 0 | 1 | 4 | b- | b+ | a+ | a- | + | - | + | + | +1 | + | - | + | + |
| 1 | 0 | 5 | a+ | a- | b- | b+ | - | - | + | - | -1 | + | + | - | + |
| 1 | 1 | 6 | b+ | b- | a+ | a- | - | + | + | + | -1 | + | - | - | - |

← 700

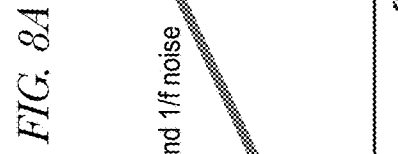

FIG. 8A

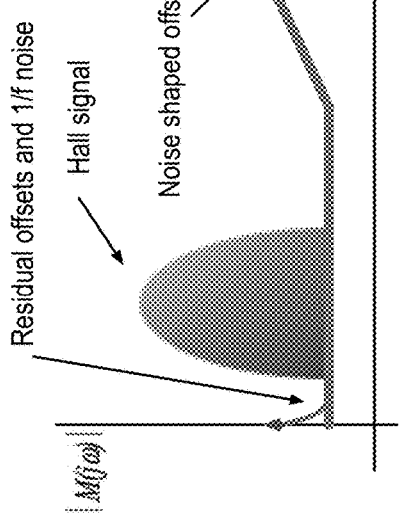

FIG. 8B

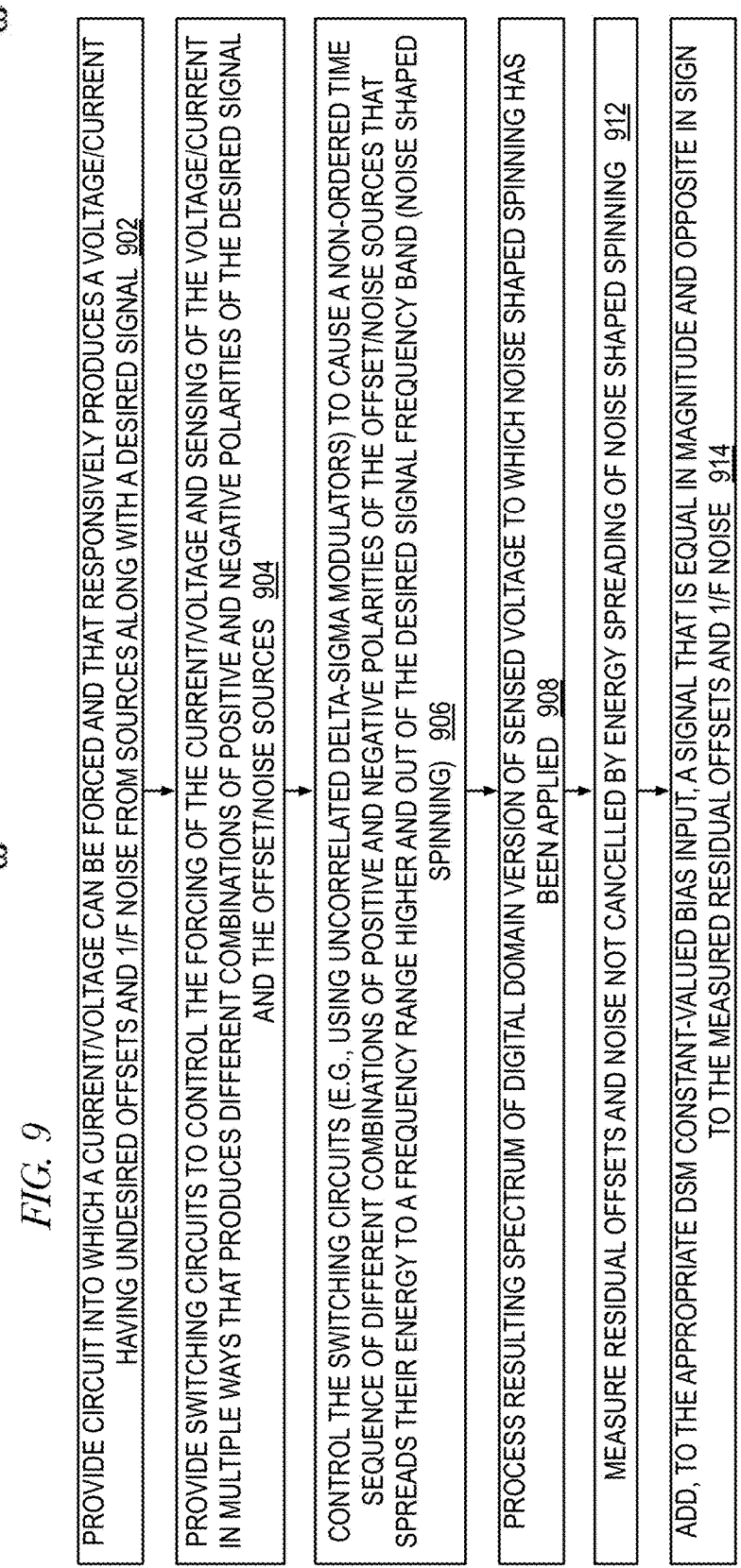

FIG. 9

PROVIDE CIRCUIT INTO WHICH A CURRENT/VOLTAGE CAN BE FORCED AND THAT RESPONSIVELY PRODUCES A VOLTAGE/CURRENT HAVING UNDESIRED OFFSETS AND 1/F NOISE FROM SOURCES ALONG WITH A DESIRED SIGNAL 902

PROVIDE SWITCHING CIRCUITS TO CONTROL THE FORCING OF THE CURRENT/VOLTAGE AND SENSING OF THE VOLTAGE/CURRENT IN MULTIPLE WAYS THAT PRODUCES DIFFERENT COMBINATIONS OF POSITIVE AND NEGATIVE POLARITIES OF THE DESIRED SIGNAL AND THE OFFSET/NOISE SOURCES 904

CONTROL THE SWITCHING CIRCUITS (E.G., USING UNCORRELATED DELTA-SIGMA MODULATORS) TO CAUSE A NON-ORDERED TIME SEQUENCE OF DIFFERENT COMBINATIONS OF POSITIVE AND NEGATIVE POLARITIES OF THE OFFSET/NOISE SOURCES THAT SPREADS THEIR ENERGY TO A FREQUENCY RANGE HIGHER AND OUT OF THE DESIRED SIGNAL FREQUENCY BAND (NOISE SHAPED SPINNING) 906

PROCESS RESULTING SPECTRUM OF DIGITAL DOMAIN VERSION OF SENSED VOLTAGE TO WHICH NOISE SHAPED SPINNING HAS BEEN APPLIED 908

MEASURE RESIDUAL OFFSETS AND NOISE NOT CANCELLED BY ENERGY SPREADING OF NOISE SHAPED SPINNING 912

ADD, TO THE APPROPRIATE DSM CONSTANT-VALUED BIAS INPUT, A SIGNAL THAT IS EQUAL IN MAGNITUDE AND OPPOSITE IN SIGN TO THE MEASURED RESIDUAL OFFSETS AND 1/F NOISE 914

Input signal ($V_{IN}$) scrambled by DSM non-ordered sequence unscrambled sequence Offset and noise ($V_{OFF}+V_N$) scrambled and spread by DSM non-ordered sequence

APPARATUS AND METHOD FOR REDUCING OFFSETS AND 1/F NOISE

BACKGROUND

Offsets and low frequency noise, also referred to as 1/f noise or pink noise, are often undesirable in electronic circuits. One solution that has been applied to remove offsets and 1/f noise is calibration. Another method is auto-zeroing for which the offsets and 1/f noise are sampled and placed in series with the input signal but with opposite polarity. Another method is correlated double sampling in which two samples are collected and the first is subtracted from the second. This method introduces a high pass filter that must be acceptable in the given application. Another approach to mitigating the effects of offsets and 1/f noise is referred to as chopping, a process by which offsets and noise are modulated to a higher frequency.

FIG. 1 is a block diagram illustrating a system 100 that includes a Hall sensor circuit and a spinning current modulation technique (SCMT) apparatus. FIG. 1, in essence, was originally presented as FIG. 1 in the paper by Vincent Mosser, Nicolas Matringe, and Youcef Haddab, "A Spinning Current Circuit for Hall Measurements Down to the Nanotesla Range", IEEE Trans. Instrum. Meas., vol. 66, no. 4, April 2017, referred to hereafter as "the SCMT paper," which is hereby incorporated by reference in its entirety for all purposes.

The system 100 includes an analog-to-digital converter (ADC) 116 (e.g., a sample-and-hold and ADC), a computer ("PC") 122, and a microcontroller 118 coupled to the computer 122. The microcontroller 118 performs the SCMT by generating clock signals C1-C9. Clock signals C1-C8 control a set of switches 106, and C9 controls the sampling rate of the ADC 116. The microcontroller 118 also performs digital demodulation. The switches 106 are coupled to a current source 102, a pre-amplifier 112, and a Hall plate 104. The Hall plate 104 is in the shape of a cross with a contact designated a+ at the north position, a contact designated a− at the south position, a contact designated b+ at the east position, and a contact designated b− at the west position, as shown. The four contacts of the Hall plate 104 are coupled to the switches 106 by an interconnect cable 108. The current source 102 has two contacts denoted I+ and I− also coupled to the switches 106. The pre-amplifier 112 measures a voltage on input contacts denoted V+ and V− that are coupled to the switches 106. The pre-amplifier 112 amplifies the measured voltage and provides the amplified voltage to an antialiasing filter 114. The filter 114 provides the filtered voltage to the ADC 116 which samples the filtered voltage and provided digital voltage values to the microcontroller 118.

The switches 106 include sixteen (16) switches that are connected to the four contacts of Hall plate 104, the two contacts of current source 102, and the two contacts of pre-amplifier 112 in such a manner as to enable eight possible ways to connect the current source 102 to the Hall plate 104 and to connect the pre-amplifier 112 to usefully measure a voltage produced by the Hall sensor 104 in response to the current forced into it by the current source 102, as shown in the table of FIG. 2, which is discussed in more detail below. This configuration enables the microcontroller 118 to control the switches 106 via the clocks C1-C8 to perform 2-dimensional chopping, which is commonly referred to as "spinning," or SCMT in the SCMT paper. The SCMT is performed on offset and noise sources, which include Hall sensor offset and 1/f noise, preamplifier (PA) offset and 1/f noise, and pickup and electromagnetic field (EMF) voltages. The microcontroller 118 controls the sixteen switches 106 via the eight clock signals C1-C8 to perform the 2-dimensional chopping. The filter 114 is not meant to remove the chopped signal, but instead performs an antialiasing function.

FIG. 2 is a table 200 that includes eight rows that correspond to eight possible configurations 1-8 to connect the current source 102 contacts I+ and I− and the pre-amplifier 112 contacts V+ and V− to the Hall plate 104 contacts a+, a−, b+, and b− of FIG. 1 that result in a useful measurement of the voltage measured by the pre-amplifier 112. The left-hand portion of table 200 includes four respective columns corresponding to contacts I+, I−, V+, and V−. Each column/row cell indicates the Hall plate 104 contact (a+, a−, b+, b−) connected to the corresponding column contact. The right-hand portion of table 200 includes four respective columns corresponding to the true/desired Hall signal, the Hall sensor offset and 1/f noise, the PA offset and 1/f noise, and the pickup and EMF voltages. The four columns indicate the resulting voltage polarity for each of the eight configurations 1-8.

FIG. 3 is a table 300 that illustrates a manner in which the microcontroller 118 of FIG. 1 may chop the various offsets and 1/f noise to a higher frequency by choosing various combinations of two pairs of configurations 1-8 of table 200 of FIG. 2 and cycling through them repeatedly, as described in more detail in the SCMT paper. More specifically, table 300 shows four rows corresponding to configurations 3-6 of FIG. 2. Four columns in the left-hand portion of table 300 indicate the connections of the contacts for the current source 102, pre-amplifier 112, and Hall plate 104 corresponding to configurations 3-6, similar to FIG. 2. Four columns in the middle portion of table 300 indicate the resulting voltage polarity of the desired Hall signal, the Hall sensor offset and 1/f noise, the PA offset and 1/f noise, and the pickup and EMF voltages for each of configurations 3-6, similar to the right-hand portion of table 200 of FIG. 2. In the right-hand portion of table 300, a column indicates a sign, i.e., +1 or −1, of demodulation performed by the microcontroller 118 on the digital filtered voltage received from the ADC 116 as necessary, e.g., for configurations 5 and 6 of table 300 to make the polarity of the Hall signal positive. Finally, in the far right-hand portion of table 300, four columns similar to the middle four columns of table 300 indicate the resulting voltage polarity of the desired Hall signal, the Hall sensor offset and 1/f noise, the PA offset and 1/f noise, and the pickup and EMF voltages after the demodulation.

It may be observed from tables 200 and 300 that two pairs of connections are required to accomplish the chopping/spinning because no single pair of connections can be chosen that will chop all of the offsets and noise; thus, the need for 2-dimensional chopping, or spinning. It may also be observed from tables 200 and 300 that some of the connections require the chopped signal to be inverted to restore the Hall signal.

FIG. 4A is a frequency spectrum graph representation of a signal generated by a Hall sensor device. FIG. 4A shows the desired Hall signal low in the frequency spectrum and shows offsets and 1/f noise also produced by the Hall sensor device even lower in the frequency spectrum.

FIG. 4B is a frequency spectrum graph representation of a result of 2-dimensional chopping of the signal of FIG. 4A generated by the Hall sensor device, more specifically of a result of chopping of the offsets and 1/f noise of FIG. 4A. A potential disadvantage of chopping is that for a sample rate of $f_s$, the 2-dimensional chopping produces a tone at $f_s/2$ and $f_s/4$. As shown in FIG. 4B, the desired Hall signal is low in the frequency spectrum, and the chopped offsets and noise appear as two tones (e.g., at $f_s/2$ and $f_s/4$) higher in the frequency spectrum. In some applications, the tones introduced by chopping may not be acceptable. More generally, for a system that employs n-dimensional chopping, the lowest produced tone will be at $f_s/2n$. That is, for each additional dimension, chopping introduces an additional tone at a frequency that is ½ the previous frequency. As the chopping dimensionality increases, the tones rapidly decrease in frequency due to the exponential nature of the lowest frequency tone produced. Keeping the low frequency tones out of the band of interest may force the chopping frequency to be set by the lowest frequency tone, which may be undesirable. Finally, if any offset remains after chopping, a signal must be fed back in order to cancel the remaining offset, which adds noise to the system.

SUMMARY

Embodiments are described that seek to mitigate the effects of offsets and 1/f noise produced by circuits for which chopping can be used to suppress offsets and 1/f noise (e.g., Hall sensor circuits), including multi-dimensional chopping. The embodiments control the switching among the different combinations of polarities of the offsets and 1/f noise in a non-ordered time sequence that spreads the energy of the offsets and 1/f noise to a frequency range higher than and out of the desired signal frequency band, which is referred to herein as "noise shaped spinning." Embodiments are described that employ uncorrelated digital Delta-Sigma modulators (DSM) to generate the switch control signals that accomplish the non-ordered time sequence to noise shape the offsets and 1/f noise to a higher and overlapped frequency range outside the signal band of the desired signal (e.g., as shown in FIG. 5). More specifically, the tendency of DSMs to generate a noisy output with no DC content when biased with a constant-valued input is exploited to generate the non-ordered time sequence of different offset and noise source polarity combinations. Additionally, the use of the DSM allows a small digital signal to be fed back and added to the constant bias input of the DSM to cancel any residual offsets and 1/f noise present after the noise shaping. The offsets themselves are used to introduce the fed back digital signal. Advantageously, the cancellation process cancels the offsets and 1/f noise without adding additional noise.

In one embodiment, the present disclosure provides an apparatus for coupling to a circuit that, in response to an input forced into the circuit, produces an output having undesired offsets and 1/f noise from sources and a desired signal, the desired signal having a frequency band, the offsets and 1/f noise having energy. The apparatus includes switching circuits controllable to force the input into the circuit and to sense the produced output in multiple ways to produce different combinations of positive and negative polarities of the desired signal and of the sources of the offsets and 1/f noise. The apparatus also includes a controller that generates a control signal that controls the switching circuits in a non-ordered time sequence of different combinations of positive and negative polarities of the sources of the offsets and 1/f noise that spreads their energy to a frequency range higher than and out of the desired signal frequency band. The non-ordered time sequence leaves the polarity of the desired signal unchanged.

In another embodiment, the present disclosure provides a method to be performed on an apparatus for coupling to a circuit that, in response to an input forced into the circuit, produces an output having undesired offsets and 1/f noise from sources and a desired signal, the desired signal having a frequency band, the offsets and 1/f noise having energy, the apparatus having switching circuits controllable to force the input into the circuit and to sense the produced output in multiple ways to produce different combinations of positive and negative polarities of the desired signal and of the sources of the offsets and 1/f noise. The method includes generating a control signal that controls the switching circuits in a non-ordered time sequence of different combinations of positive and negative polarities of the sources of the offsets and 1/f noise that spreads their energy to a frequency range higher than and out of the desired signal frequency band. The non-ordered time sequence leaves the polarity of the desired signal unchanged.

In one embodiment, the controller comprises one or more uncorrelated delta-sigma modulators (DSM) that generate the control signal. In one embodiment, the controller includes a digital signal processor (DSP) that processes a resulting spectrum of a digital domain version of the sensed output to measure residual offsets and 1/f noise not cancelled by the spreading of the offsets and 1/f noise energy by the non-ordered time sequence. The DSP feeds back the measured residual offsets and 1/f noise to the one or more DSMs to cancel the residual offsets and 1/f noise by adding to an input present at the one or more of the DSMs a signal equal in magnitude and opposite in sign to the measured residual offsets and 1/f noise. In one embodiment, the input present at the one or more uncorrelated DSMs is biased with a constant value that causes each DSM to produce an equal number of its' two possible output values. In one embodiment, the DSP comprises the one or more uncorrelated DSMs.

BRIEF DESCRIPTION OF THE DRAWINGS

FIG. 2 is a related art table that includes eight rows that correspond to eight possible configurations to connect the current source contacts and the pre-amplifier contacts to the Hall plate contacts of FIG. 1.

FIG. 3 is a related art table that illustrates a manner in which the microcontroller of FIG. 1 may chop the various offsets and 1/f noise to a higher frequency by choosing various combinations of two pairs of configurations 1-8 of the table of FIG. 2 and cycling through them repeatedly.

FIG. 7 is a table illustrating different configurations of the system of FIG. 6.

FIG. 8A is a frequency spectrum graph representation illustrating residual offset and 1/f noise that might remain after application of noise shaped spinning.

FIG. 8B is a frequency spectrum graph representation illustrating the frequency spectrum after the residual offset and 1/f noise have been eliminated, as described with respect to FIG. 9.

FIG. 9 is a flowchart illustrating operation of noise shaped spinning as well as the cancelling of residual offset/noise from the application of noise shaped spinning, e.g., operation of the system of FIG. 6.

DETAILED DESCRIPTION

Figure 4A:
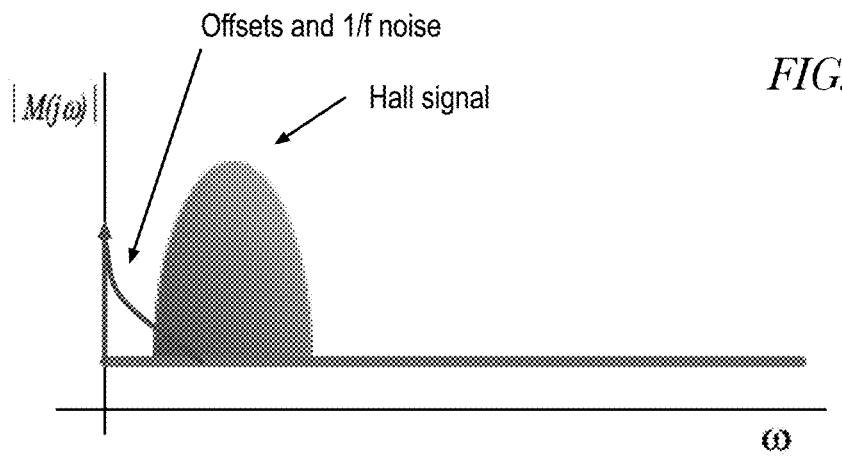
FIG. 4A is a related art frequency spectrum graph representation of a signal generated by a Hall sensor device of FIG. 1.
Figure 4B:
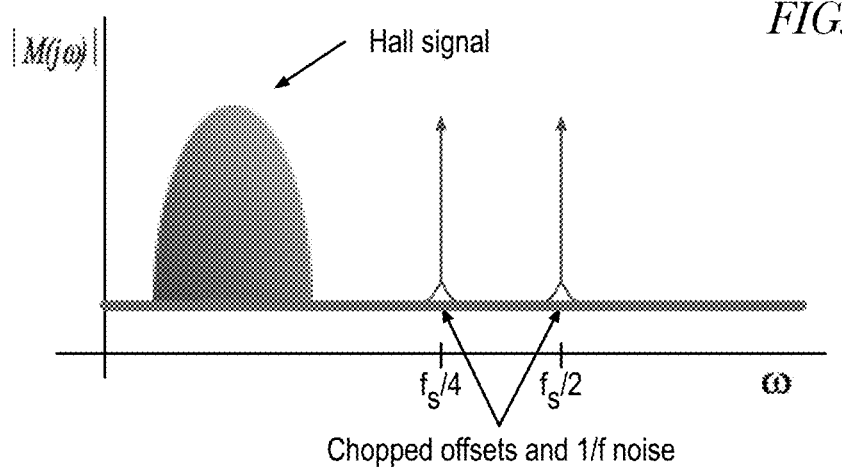
FIG. 4B is a related art frequency spectrum graph representation of a result of 2-dimensional chopping of the signal of FIG. 4A generated by the Hall sensor device, more specifically of a result of chopping of the offsets and 1/f noise of FIG. 4A.
Figure 5:
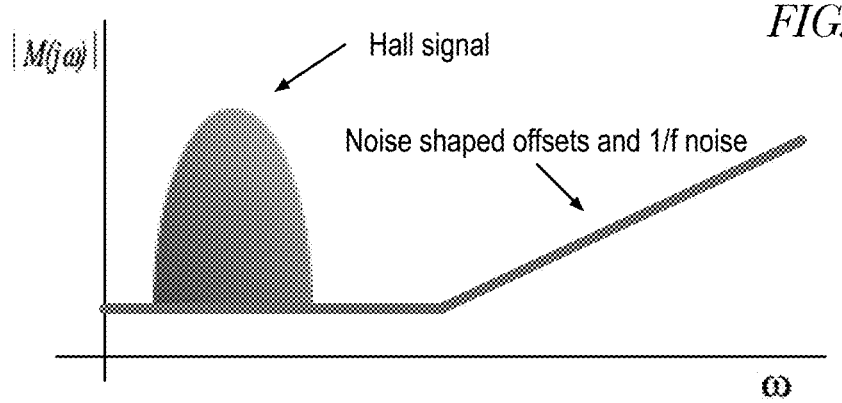
FIG. 5 is a frequency spectrum graph representation of a result of noise shaped spinning of a signal generated by a Hall sensor device, e.g., the signal of FIG. 4A.

As described above, the conventional method of chopping introduces tones, such as those shown in FIG. 4B, which may be unacceptable in some applications. The tones are introduced by the fact that the various different connections are controlled in an ordered sequence that is repeated (e.g., the ordered sequence of configurations 3, 4, 5, 6 is repeated continuously in the embodiment of FIG. 1 according to table 300 of FIG. 3). However, advantageously, the present embodiments control the different combinations of positive and negative polarities of offset and 1/f noise sources in a non-ordered time sequence that causes the energy of the offsets and 1/f noise to be spread to a frequency range out of the frequency band of the desired signal (e.g., as shown in FIG. 5). By spreading the offsets and noise across a wider frequency range, advantageously a similar level of energy reduction may be obtained by using a filter that attenuates less than a filter required by a conventional chopping approach that produces the tones. Additionally, the tones produced by a chopping approach may undesirably reduce the spurious free dynamic range in contrast to the described embodiments. Uncorrelated DSMs biased with an appropriately chosen constant input may be employed to generate the control signals to accomplish the non-ordered time sequence. The noisy nature of the output of DSMs with constant-biased inputs advantageously provides the non-ordered time sequence of offset/noise source polarity combinations.

FIG. 5 is a frequency spectrum graph representation of a result of noise shaped spinning of a signal generated by a Hall sensor device, e.g., the signal of FIG. 4A. The graph shows the desired Hall signal low in the frequency spectrum and the noise shaped offsets and noise appearing higher in the frequency spectrum above the desired signal frequency band. As may be observed by comparing the graph of FIG. 5 with the graph of FIG. 4B, the embodiments described herein (e.g., with respect to FIG. 6 and FIG. 10) advantageously do not produce the tones that the conventional chopping technique produces (e.g., the tones shown in FIG. 4B) and as described above. Rather, the undesired offsets and 1/f noise have their energy spread over a relatively large portion of the frequency spectrum away from the desired signal frequency band.

Figure 6:
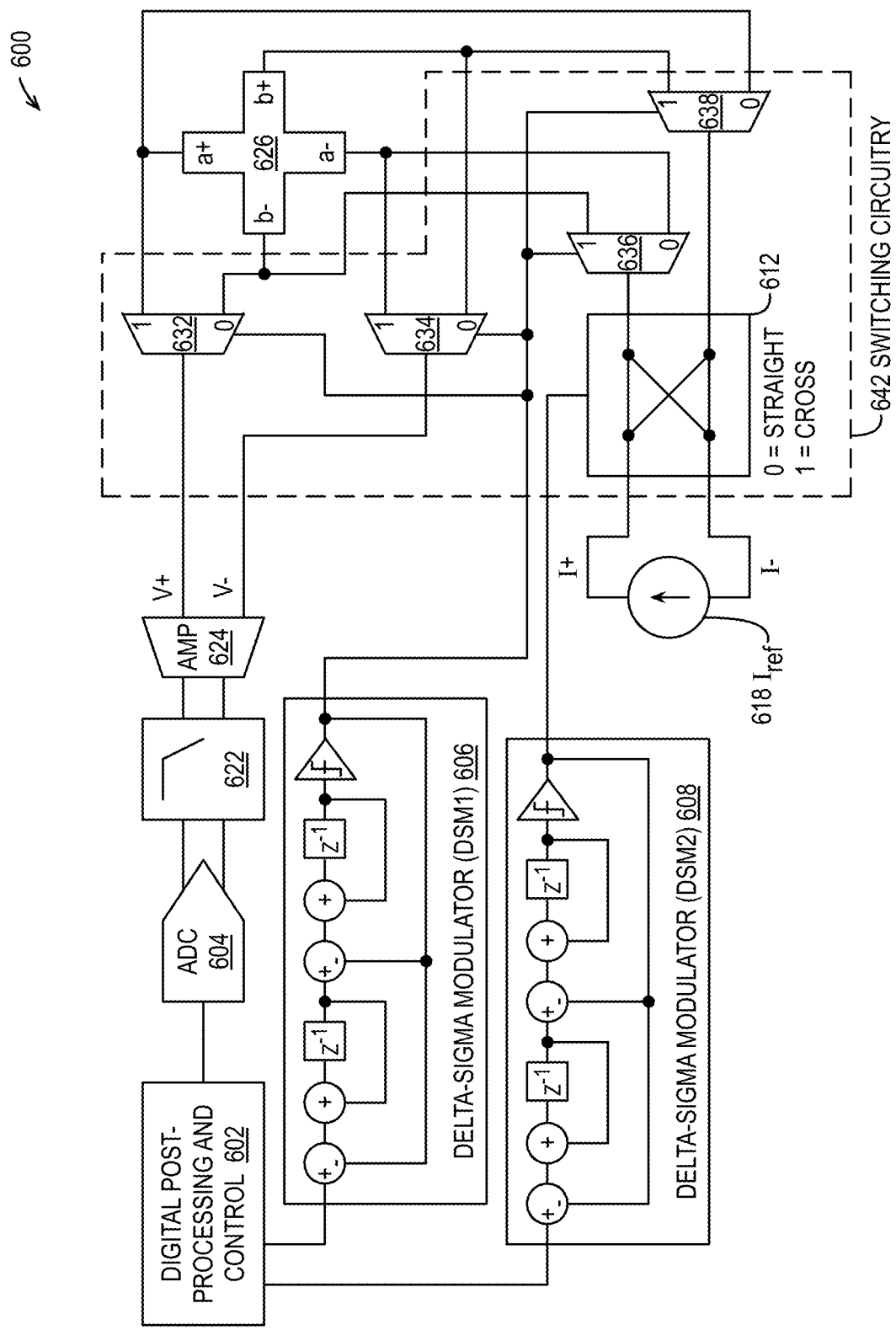
FIG. 6 is a block diagram of a system in which noise shaped spinning is performed on a voltage produced by a Hall sensor circuit.

FIG. 6 is a block diagram of a system 600 in which noise shaped spinning is performed on a voltage produced by a Hall sensor circuit, and FIG. 7 is a table 700 illustrating different configurations of the system 600 of FIG. 6. FIG. 6 and FIG. 7 will be described together.

The system 600 includes digital post-processing and control circuitry 602, e.g., a digital signal processor (DSP), that receives a digital signal from an analog-to-digital converter (ADC) 604 and that drives control values into uncorrelated delta-sigma modulators (DSMs) 606 and 608. Included in the digital signal received from the ADC 604 is the desired signal (e.g., Hall plate voltage that may be used in a hand-held device to measure and provide orientation information on nearby magnetic fields, or in a motor to provide positioning information) that the DSP 602 may use to perform a control function or output function within the system 600. The ADC 604 receives an analog voltage on analog inputs denoted V+ and V− in FIG. 6 from an anti-aliasing filter 622 and converts it to the digital voltage signal provided to the DSP 602. The filter 622 receives an amplified voltage from a pre-amplifier ("AMP") 624 that amplifies a sensed voltage produced by a Hall plate 626 and indirectly provided to the pre-amplifier 624 by switching circuitry 642, described in more detail below.

The Hall plate 626 has contacts labeled a+, a−, b+, and b−, as shown. The switching circuitry 642 includes two 2-input analog switches, or muxes, connected to the Hall plate 626. The first mux 632 has the a+ contact coupled to its 1-valued input and the b− input coupled to its 0-valued input. The second mux 634 has the a− contact coupled to its 1-valued input and the b+ input coupled to its 0-valued input. The output of the first mux 632 is coupled to a positive polarity input of the pre-amplifier 624, and the output of the second mux 634 is coupled to a negative polarity input of the pre-amplifier 624. The switching circuitry 642 also includes two 2-output analog switches, or demuxes, connected to the Hall plate 626. The first demux 636 has the b− contact coupled to its 1-valued output and the a− input coupled to its 0-valued output. The second demux 638 has the b+ contact coupled to its 1-valued input and the a+ input coupled to its 0-valued output. The switching circuitry 642 also includes a cross switch 612. The input of the first demux 636 is coupled to a first output of the cross switch 612, and the input of the second demux 638 is coupled to a second output of the cross switch 612. Each of the muxes 632/634 and demuxes 636/638 are controlled by a control output of a first delta-sigma modulator (DSM1) 606.

A first input of the cross switch 612 is coupled to a positive polarity output of a reference current source 618, and a second input of the cross switch 612 is coupled to a negative polarity output of the reference current source 618. The cross switch 612 is controlled by a control output of a second delta-sigma modulator (DSM2) 608. DSM2 608 is independent of and uncorrelated with DSM1 606. The DSMs 606/608 are uncorrelated in the following aspect. In a system with two DSMs, for example, if the output of the ADC 604 is multiplied by a first sequence from a first DSM, the offsets and noise that were originally scrambled by the first sequence are recovered, whereas all of the other offsets and noise scrambled by a second sequence from the second/other DSM remain scrambled; conversely, if the output of the ADC 604 is multiplied by the second sequence from the second DSM, the offsets and noise that were scrambled by the second sequence are recovered, whereas all of offsets and noise scrambled by the first sequence remain scrambled. When the control output of DSM2 608 is zero, the cross switch 612 connects the positive polarity output of the current source 618 to the input of the first demux 636 and connects the negative polarity output of the current source 618 to the input of the second demux 638; and when the control output of DSM2 608 is one, the cross switch 612 connects the positive polarity output of the current source 618 to the input of the second demux 638 and connects the negative polarity output of the current source 618 to the input of the first demux 636, thus operating as a polarity inverter.

DSM1 606 and DSM2 608 control the switching circuitry 642 to connect the Hall plate 626 contacts to the current source 618 and the pre-amp 624 in four different configurations as described in table 700 of FIG. 7 and, as described in more detail below, do so in a non-ordered time sequence of outputs, e.g., a non-ordered time sequence of ones and zeros (or negative ones and positive ones). Additionally, the DSMs 606/608 may be dithered to further reduce small amounts of undesired tonality that might otherwise be exhibited. For example, noise may be added at the input of the DSM quantizers, where the noise source of each DSM is independent of the others. When the output of DSM2 608 is a zero and DSM1 606 is a zero, the positive contact I$^+$ of the current source 618 is connected to the a− contact, the negative contact I$^-$ of the current source 618 is connected to the a+ contact, the positive contact V$^+$ of the pre-amp 624 is connected to the b− contact, and the negative contact V$^-$ of the pre-amp 624 is connected to the b+ contact, which is referred to as configuration 3 in table 700. When the output of DSM2 608 is a zero and DSM1 606 is a one, the positive contact I$^+$ of the current source 618 is connected to the b− contact, the negative contact I$^-$ of the current source 618 is connected to the b+ contact, the positive contact V$^+$ of the pre-amp 624 is connected to the a+ contact, and the negative contact V$^-$ of the pre-amp 624 is connected to the a− contact, which is referred to as configuration 4 in table 700. When the output of DSM2 608 is a one and DSM1 606 is a zero, the positive contact I$^+$ of the current source 618 is connected to the a+ contact, the negative contact I$^-$ of the current source 618 is connected to the a− contact, the positive contact V$^+$ of the pre-amp 624 is connected to the b− contact, and the negative contact V$^-$ of the pre-amp 624 is connected to the b+ contact, which is referred to as configuration 5 in table 700. When the output of DSM2 608 is a one and DSM1 606 is a one, the positive contact I$^+$ of the current source 618 is connected to the b+ contact, the negative contact I$^-$ of the current source 618 is connected to the b− contact, the positive contact V$^+$ of the pre-amp 624 is connected to the a+ contact, and the negative contact V$^-$ of the pre-amp 624 is connected to the a− contact, which is referred to as configuration 6 in table 700.

As also shown in FIG. 7, each configuration (e.g., 3, 4, 5, 6) of table 700 is a different combination of polarities of the different sources of offsets and 1/f noise generated by the system 600, e.g., offset and 1/f noise sourced by the Hall plate 626 as the current source 618 forces the reference current into it, offset and 1/f noise sourced by the pre-amplifier 624 that senses the voltage produced by the Hall plate 626 in response to the forced current, and offset and 1/f noise sourced due to various aspects related to the interconnection to the Hall plate 626. For example, in one embodiment, the Hall plate 626 is off-chip and the other elements of the system 600 are on-chip, which implies a conducting cable or other similar connection circuitry between the off-chip Hall plate 626 and the on-chip switches which may result in an out-of-phase EMF caused by the magnetic field being measured, external noise pickup, and/or a time-dependent thermoelectric voltage. As shown in table 700, the polarity of the desired Hall signal is retained at a positive polarity for all four configurations when a final inversion of the signal is performed after the ADC 604, e.g., by DSP 602. In one embodiment, the Hall plate 626 may be employed on a hand-held device, for example, to measure and provide orientation information on nearby magnetic fields. In another embodiment, the Hall plate 626 may be employed in a motor to provide positioning information.

A characteristic of a DSM (e.g., DSM 406/408) is that when biased with a constant-valued input, e.g., zero, it will produce an output that is on average the constant input value, but in a noisy fashion. The noise associated with the DSM 606/608 output signal is a high frequency noise that is advantageously used to control the switching circuitry 642 such that a non-ordered time sequence of the different configurations (e.g., configurations 3, 4, 5, 6 of table 700) is obtained, which has the advantage of spreading the energy of the offsets/noise to a frequency region outside the designed signal frequency band. The digital post-processing and control 602 generally (also see description of embodiments of FIGS. 8A, 8B and 9 below regarding residual offset/noise cancellation) drives a constant-valued signal into each of the DSMs 606/608 that causes the DSMs 606/608 to produce an average output with effectively no DC content. Stated alternatively, the constant input to a DSM 606/608 has a value that will cause the DSM to, on average, produce an equal number of its two possible output values (e.g., an equal number of zeros and ones, or an equal number of negative ones and positive ones). For example, in an embodiment in which the DSMs 606/608 generate control output values of zero and one as shown in table 700, the DSMs 606/608 may be biased with an input value of one-half. In an alternate embodiment in which the DSMs 606/608 generate control output values of negative one and positive one, the DSMs 606/608 may be biased with an input value of zero. In the embodiment of FIG. 6, the DSMs 606/608 are second-order DSMs, as shown. However, the order of the DSMs may be chosen to accomplish the amount of offset and 1/f noise energy spread as needed by the application for which the noise shaped spinning is employed, and other embodiments are contemplated in which the order of the DSMs is other than two, e.g., one or three or four, depending upon the need. In one embodiment, the DSP 602 may dynamically add a small control signal to the otherwise constant DSM 606/608 input bias value in order to eliminate any residual offset and 1/f noise around DC that remains, even though the noise shaped spinning is performed, as described below with respect to FIGS. 8 and 9. However, it is noted that embodiments are contemplated in which the residual noise elimination is not performed, in which case the DSM 606/608 inputs may be tied to the constant bias input value, e.g., to zero.

Preferably, the DSP 602 and the DSM 606/608 operate in the digital domain, whereas the filter 622, pre-amplifier 624, Hall plate 626, current source 618 and switching circuitry 642 operate in the analog domain.

The embodiment having the Hall plate requires four different combinations of the noise source polarities to accomplish the noise shaped spinning, which implies two bits to specify the four different states. However, in other embodiments in which the number of required states is different than four, the number of bits of the control signal that controls the switching circuitry 642 may be different. For example, if the number of required states is eight, then three bits are required for the control signal. For another example, if the number of required states is two, then one bit for the control signal will suffice, as in the example of FIG. 10 described below.

In an alternate embodiment, rather than employing DSMs to generate the non-ordered time sequence of noise source polarity combinations, the DSP 602 includes a stored non-ordered time sequence that it accesses to directly generate the control signals for switching circuitry 642. For example, the output of a lengthy time sequence of uncorrelated constant-biased DSMs may be recorded and stored within a non-volatile memory of the DSP 602, where the recorded sequence is sufficiently long that its eventual repetition does not introduce unacceptable tonality. Alternatively, the DSP 602 may draw upon other sources of noise that is absent DC content to generate the non-ordered time sequence.

FIG. 8A is a frequency spectrum graph representation illustrating residual offset and 1/f noise that might remain after application of noise shaped spinning. As mentioned above, in a given system some residual offset and noise may remain even after noise shaped spinning is performed.

FIG. 8B is a frequency spectrum graph representation illustrating the frequency spectrum after the residual offset and 1/f noise have been eliminated, as described with respect to FIG. 9 below. The residual offset and noise can be eliminated by measuring it in the digital domain (e.g., by the DSP 602) and feeding a digital value back to the input of the appropriate DSM 606/608 so that the DSM 606/608 introduces an equal magnitude but opposite polarity output. This elimination is possible because the residual offset/noise will be smaller than the original offset/noise sought to be eliminated by the noise shaped spinning. Additionally, the process to remove the residual offset/noise does not add additional noise because it makes use of the offsets themselves. Because the magnitude of the added digital value is small relative to the original offsets and noise spread by the noise shaped spinning, its effect on the spreading of the energy of the original offsets and noise is also relatively small. The process to remove the residual offset/noise will now be described in FIG. 9 in more detail and in the context of noise shaped spinning.

FIG. 9 is a flowchart illustrating operation of noise shaped spinning as well as the cancelling of residual offset/noise from the application of noise shaped spinning, e.g., operation of the system 600 of FIG. 6. The operation begins at block 902.

At block 902, a circuit is provided into which an input (e.g., current/voltage) may be forced and that responsively produces an output (e.g., voltage/current) having a desired signal along with undesired offsets and 1/f noise. The Hall plate 626, pre-amplifier 624, filter 622, ADC 604 and/or interconnect circuitry of FIG. 6 are an example. Another example is the circuit of FIG. 10 that produces the input voltage, $V_{IN}$. The operation proceeds to block 904.

Figure 10:
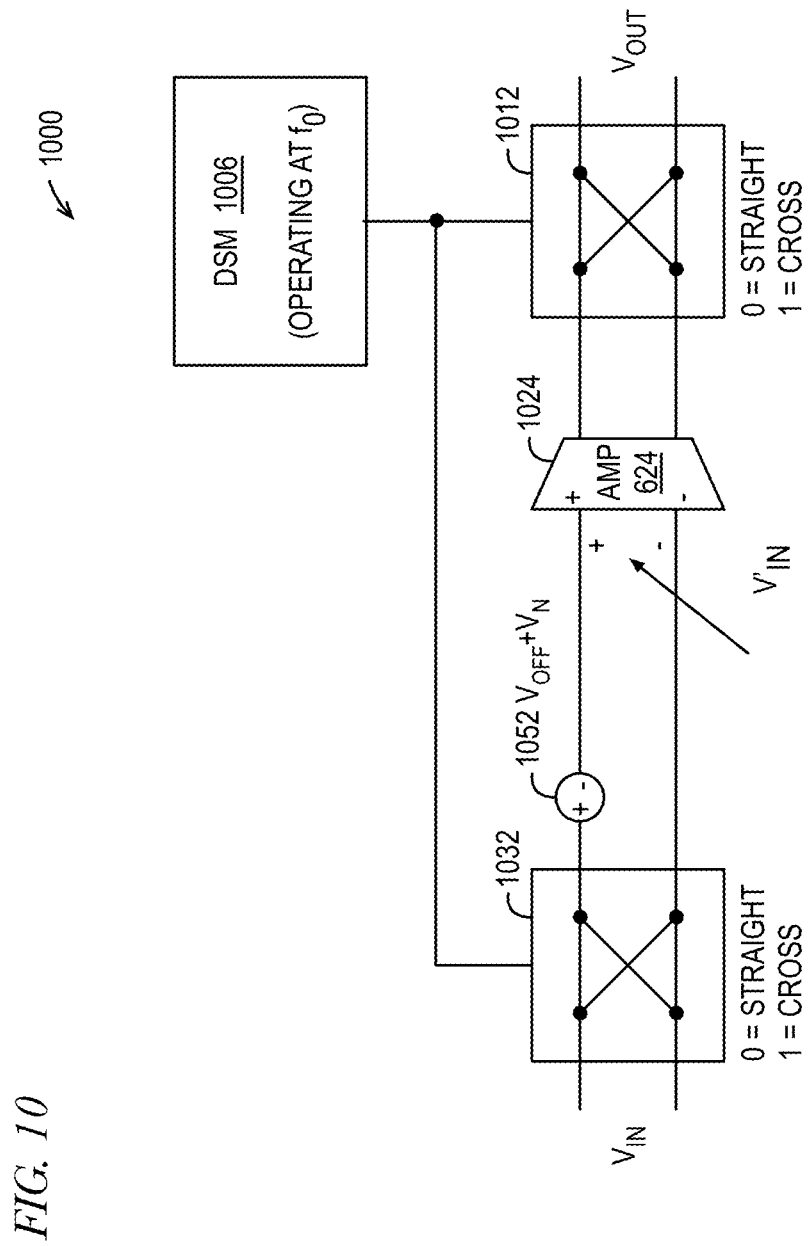
FIG. 10 is a block diagram of a system in which noise shaped spinning is performed according to an alternate embodiment.

At block 904, switching circuits are provided to control the forcing of the input into the circuit of block 902 and the sensing of the produced output in multiple ways that produces different combinations of positive and negative polarities of the desired signal and of the offset/noise sources. The switching circuitry 642 of FIG. 6 is an example. The cross switches 1012 and 1032 of FIG. 10 are another example. The operation proceeds to block 906.

At block 906, the switching circuits are controlled to cause a non-ordered time sequence of different combinations of positive and negative polarities of the offset and 1/f noise sources that spreads their energy to a frequency range higher than and out of the desired signal frequency band, which is referred to herein as noise shaped spinning, as described herein. Preferably, the non-ordered time sequence of control signals that control the switching circuits to cause the non-ordered time sequence of different combinations of positive and negative polarities of the offset and 1/f noise sources that spreads their energy to a frequency range higher than and out of the desired signal frequency band is taken from the output of uncorrelated DSMs (e.g., DSM 606 and 608 of FIG. 6, DSM 1006 of FIG. 10). The operation proceeds to block 908.

At block 908, the DSP 602 processes a resulting spectrum of the digital voltage it receives from the ADC 604. The received voltage is a digital version of the amplified and filtered voltage sensed from the Hall plate 626 in response to the current forced into it while noise shaped spinning is occurring, i.e., while the DSMs 606/608 control the switching circuitry 642 to connect the current source 618, sensing circuitry (e.g., pre-amplifier 624, filter 622, and/or ADC 604), and contacts of the Hall plate 626 according to the various configurations of table 700 in a non-ordered time sequence, which is accomplished due to the noisy nature of the uncorrelated DSM 606/608 outputs resulting from constant input biasing, as described above. The operation proceeds to block 912.

At block 912, the DSP 602 measures the residual offsets and noise not cancelled by the energy spreading of the noise shaped spinning. The DSP 602 has knowledge of the noisy uncorrelated DSM 606/608 sequences which it uses to recover offsets and noise that may be used as feedback for cancellation. In one embodiment, the DSP 602 has the knowledge because it comprises the DSMs 606/608 (i.e., is implementing the DSMs 606/608) and is therefore generating the non-ordered time sequence. In another embodiment, the outputs of DSMs 606/608 are provided back to the DSP 602 such that the DSP 602 may know the non-ordered time sequence. The operation proceeds to block 914.

At block 914, the DSP 602 adds to the appropriate DSM 606/608 constant input value a signal that is equal in magnitude and opposite in sign to the residual offsets and 1/f noise measured at block 912 to slightly modify the non-ordered time sequence caused by a purely constant input in order to introduce a small DC component to cancel the residual offsets and 1/f noise while continuing to spread the energy of the original offsets and 1/f noise. Advantageously, the addition of the small equal magnitude opposite sign signal does not add noise to the system 600 because it uses the residual offsets and noise themselves for the cancellation. Furthermore, the resolution of the residual offset/noise cancellation is limited only by the resolution of the DSMs 606/608. The residual offset/noise cancellation approach, e.g., of FIG. 9, has an advantage over chopping because to suppress the offset/noise with chopping would require the introduction of more chopping states so that the duty cycle of the various states may be modulated, and doing so creates a dependence between the chopping tone and the cancellation. In contrast, the embodiment described in FIG. 9 makes the shaped offsets and noise and the desired signal independent of each other to first order. The operation ends at block 914.

Although embodiments have been described in which the circuit upon which noise shaped spinning is performed is a Hall sensor circuit, it should be understood that the embodiments described may be modified to perform noise shaped spinning on circuits other than Hall sensor circuits and which otherwise might conventionally have their offsets and 1/f noise chopped. (As described above, chopping may have the side effect of introducing potentially undesirable tones, including relatively low frequency tones as the chopping dimensionality increases which may require an undesirably high sampling frequency.) For example, noise shaped spinning may be performed on circuits that have different numbers of offset and 1/f noise sources than those described with respect to the Hall sensor circuit. An example will now be described with respect to FIG. 10.

Figure 11:
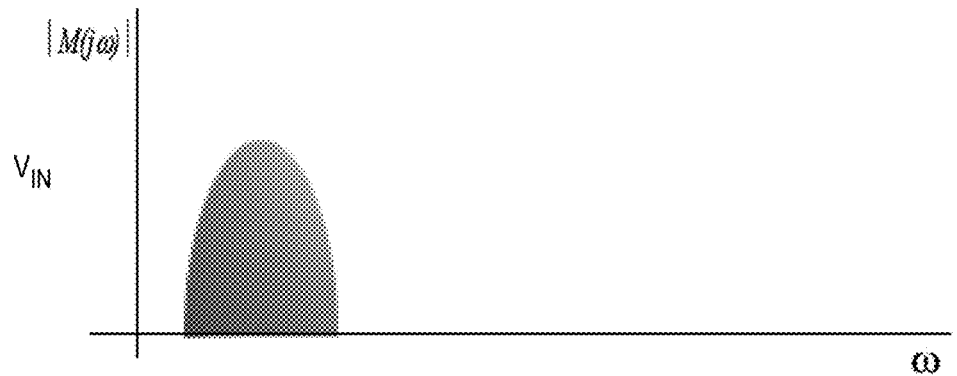
FIGS. 11 through 13 are frequency spectrum graph representations that illustrate the operation of the system of FIG. 10.
Figure 12:
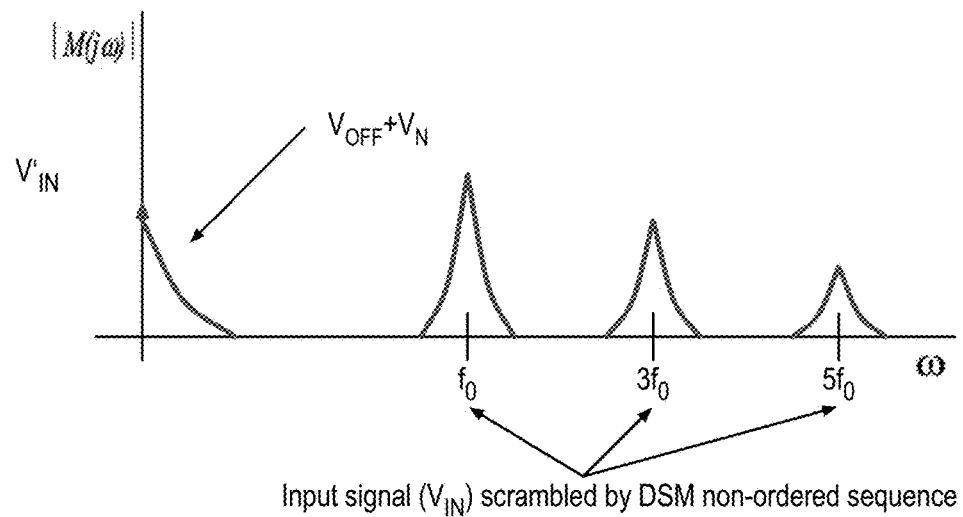
Figure 13:
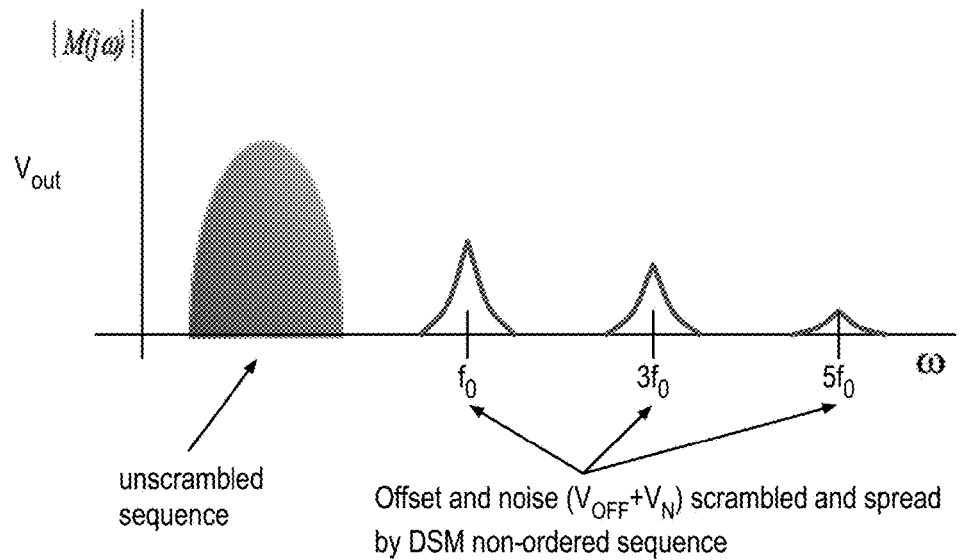

FIG. 10 is a block diagram of a system 1000 in which noise shaped spinning is performed according to an alternate embodiment, and FIGS. 11 through 13 are frequency spectrum graph representations that illustrate the operation of the system 1000 of FIG. 10. FIGS. 10 through 13 will now be described together.

The system 1000 receives an input voltage, $V_{IN}$, and produces an output voltage, $V_{OUT}$. Input voltage $V_{IN}$ is illustrated in the frequency spectrum graph representation of FIG. 11. Input voltage $V_{IN}$ is received by a first cross switch 1032 similar to cross switch 612 of FIG. 6. The cross switch 1032 is controlled by a single-bit control input generated by a DSM 1006 operating at a frequency designated $f_0$. The input of the DSM 1006 is constant-biased, similar to the DSMs 606/608 described above with respect to FIG. 6. When the DSM 1006 produces a zero output, input voltage $V_{IN}$ is passed through the cross switch 1032, and when the DSM 1006 produces a one output, the cross switch 1032 inverts input voltage $V_{IN}$. Thus, input voltage $V_{IN}$ is modulated by the non-ordered time sequence of the control signal generated by the DSM 1006. The result is added to an offset and 1/f noise presented at the input to an amplifier 1024. The offset and 1/f noise source is shown in FIG. 10 as $V_{OFF}+V_N$ 1052. The result, $V'_{IN}$, is shown in FIG. 12 in which the offset and 1/f noise remain at DC and input voltage $V_{IN}$ is modulated to higher frequencies, which are shown in FIG. 12 centered around $f_0$, $3f_0$, and $5f_0$. The resulting spectrum shown in FIG. 12 is passed through a second cross switch 1012 that is controlled by the same DSM 1006 output as the first cross switch 1032. The modulation by the second cross switch 1012 has the effect of reversing the modulation of input voltage $V_{IN}$ by the first cross switch 1032 and restoring $V_{IN}$ to its original form, while the modulation of the offset and 1/f noise by the second cross switch 1012 (i.e., by the non-ordered time sequence generated by the DSM 1006) spreads their energy to higher frequencies, e.g., centered around $f_0$, $3f_0$, and $5f_0$, as shown in FIG. 13. As may be observed from FIG. 13, advantageously the offset and 1/f noise are noise shaped rather than being tonal as they would be with the conventional chopping technique.

Generally speaking, embodiments are described of an apparatus and method for reducing the offset and 1/f noise in a circuit that, in response to a input (e.g., current/voltage) forced into the circuit, produces an output (e.g., voltage/current) having a desired signal and the undesired offsets and 1/f noise, e.g., a Hall sensor. The embodiments may be employed for circuits in which the offset and 1/f noise have traditionally been removed via chopping, especially those that require multi-dimensional chopping. Still further, it should be noted that, advantageously, the noise shaped spinning approach does not prevent the noise-shaped, i.e., energy-spread, offsets and 1/f noise from being demodulated and removed with feedback if desired.

Although embodiments have been described in which the non-ordered time sequence uses fewer different combinations than the maximum possible number of combinations of the offset and 1/f noise source polarities, it should be understood that the maximum number of combinations may be used in the non-ordered time sequence. For example, with respect to the embodiment of FIG. 6, three DSMs could be employed to generate a three-bit control signal, and the switching circuitry could be modified to support eight different combinations of the offset and 1/f noise polarities (e.g., configurations 1 through 8 of FIG. 2). However, in this case the number of DSMs employed may be more than is needed to accomplish the spreading of the offsets and 1/f noise out of the desired signal frequency band. Furthermore, it should also be understood that even though fewer than the maximum number of combinations may be used in the non-ordered time sequence, nevertheless a combination must be used that provides sufficient orthogonality of the various offset and 1/f noise source polarities to spread them out of the desired signal frequency band. Stated alternatively, at a minimum, enough combinations must be chosen that an even number of positive and negative polarities are obtained for each offset and noise source while retaining a single polarity for the desired signal source. Using the example of FIG. 6, different combinations 3, 4, 5, and 6 in a non-ordered time sequence satisfy the requirement. However, the different combinations 1, 2, 7, and 8 in a non-ordered time sequence also satisfy the requirement, for another example.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art and are construed as being without limitation to such specifically recited examples and conditions. Although embodiments of the present disclosure have been described in detail, it should be understood that various changes, substitutions, and alterations could be made hereto without departing from the spirit and scope of the disclosure.

The invention claimed is:

1. An apparatus for coupling to a circuit that, in response to an input forced into the circuit, produces an output having undesired offsets and 1/f noise from sources and a desired signal, the desired signal having a frequency band, the offsets and 1/f noise having energy, the apparatus comprising:

switching circuits controllable to force the input into the circuit and to sense the produced output in multiple ways to produce different combinations of positive and negative polarities of the desired signal and of the sources of the offsets and 1/f noise; and a controller that generates a control signal that controls the switching circuits in a non-ordered time sequence of different combinations of positive and negative polarities of the sources of the offsets and 1/f noise that spreads their energy to a frequency range higher than and out of the desired signal frequency band, wherein the non-ordered time sequence leaves the polarity of the desired signal unchanged.

2. The apparatus of claim 1, wherein the controller comprises one or more uncorrelated delta-sigma modulators (DSM) that generate the control signal.

3. The apparatus of claim 2, wherein the control signal has N bits; wherein the different combinations of positive and negative polarities of the sources of the offsets and 1/f noise of the non-ordered time sequence is less than or equal to $2^N$ combinations; and wherein the one or more uncorrelated DSMs comprise N uncorrelated DSMs that respectively generate the N bits of the control signal.

4. The apparatus of claim 3, wherein N is 2 or greater.

5. The apparatus of claim 2, wherein each DSM of the one or more uncorrelated DSMs generates two possible output values; and wherein for each DSM of the one or more uncorrelated DSMs, an input of the DSM is biased with an average value of the two possible output values of the DSM.

6. The apparatus of claim 2, wherein the controller further comprises a digital signal processor (DSP) that processes a resulting spectrum of a digital domain version of the sensed output to measure residual offsets and 1/f noise not cancelled by the spreading of the offsets and 1/f noise energy by the non-ordered time sequence; and wherein the DSP feeds back the measured residual offsets and 1/f noise to the one or more DSMs to cancel the residual offsets and 1/f noise by adding to an input present at the one or more of the DSMs a signal equal in magnitude and opposite in sign to the measured residual offsets and 1/f noise.

7. The apparatus of claim 6, wherein each DSM of the one or more uncorrelated DSMs generates two possible output values; and wherein for each DSM of the one or more uncorrelated DSMs, the input present at the DSM is biased with an average value of the two possible output values of the DSM.

8. The apparatus of claim 6, wherein the measured residual offsets and 1/f noise fed back to the one or more DSMs do not add noise to the sensed output.

9. The apparatus of claim 6, wherein the DSP comprises the one or more DSMs.

10. The apparatus of claim 1, wherein the circuit that produces the output having the desired signal and undesired offsets and 1/f noise comprises a Hall sensor circuit.

11. A method to be performed on an apparatus for coupling to a circuit that, in response to an input forced into the circuit, produces an output having undesired offsets and 1/f noise from sources and a desired signal, the desired signal having a frequency band, the offsets and 1/f noise having energy, the apparatus having switching circuits controllable to force the input into the circuit and to sense the produced output in multiple ways to produce different combinations of positive and negative polarities of the desired signal and of the sources of the offsets and 1/f noise, the method comprising:
generating a control signal that controls the switching circuits in a non-ordered time sequence of different combinations of positive and negative polarities of the sources of the offsets and 1/f noise that spreads their energy to a frequency range higher than and out of the desired signal frequency band, wherein the non-ordered time sequence leaves the polarity of the desired signal unchanged.

12. The method of claim 11, wherein the control signal is generated by one or more uncorrelated delta-sigma modulators (DSM).

13. The method of claim 12, wherein the control signal has N bits; wherein the different combinations of positive and negative polarities of the sources of the offsets and 1/f noise of the non-ordered time sequence is less than or equal to $2^N$ combinations; and wherein the one or more uncorrelated DSMs comprise N uncorrelated DSMs that respectively generate the N bits of the control signal.

14. The method of claim 13, wherein N is 2 or greater.

15. The method of claim 12, wherein each DSM of the one or more uncorrelated DSMs generates two possible output values; and wherein for each DSM of the one or more uncorrelated DSMs, an input of the DSM is biased with an average value of the two possible output values of the DSM.

16. The method of claim 12, processing, by a digital signal processor (DSP), a resulting spectrum of a digital domain version of the sensed output to measure residual offsets and 1/f noise not cancelled by the spreading of the offsets and 1/f noise energy by the non-ordered time sequence; and feeding back, by the DSP, the measured residual offsets and 1/f noise to the one or more DSMs to cancel the residual offsets and 1/f noise by adding to an input present at the one or more of the DSMs a signal equal in magnitude and opposite in sign to the measured residual offsets and 1/f noise.

17. The method of claim 16, wherein each DSM of the one or more uncorrelated DSMs generates two possible output values; and wherein for each DSM of the one or more uncorrelated DSMs, the input present at the DSM is biased with an average value of the two possible output values of the DSM.

18. The method of claim 16, wherein the measured residual offsets and 1/f noise fed back to the one or more DSMs do not add noise to the sensed output.

19. The method of claim 16, wherein the DSP comprises the one or more DSMs.

20. The method of claim 11, wherein the circuit that produces the output having the desired signal and undesired offsets and 1/f noise comprises a Hall sensor circuit.

* * * * *

UNITED STATES PATENT AND TRADEMARK OFFICE
CERTIFICATE OF CORRECTION

Page 1 of 1

PATENT NO. : 10,690,730 B2
APPLICATION NO. : 16/003078
DATED : June 23, 2020
INVENTOR(S) : Eric Kimball It is certified that error appears in the above-identified patent and that said Letters Patent is hereby corrected as shown below:

In the Drawings

Figure 1:
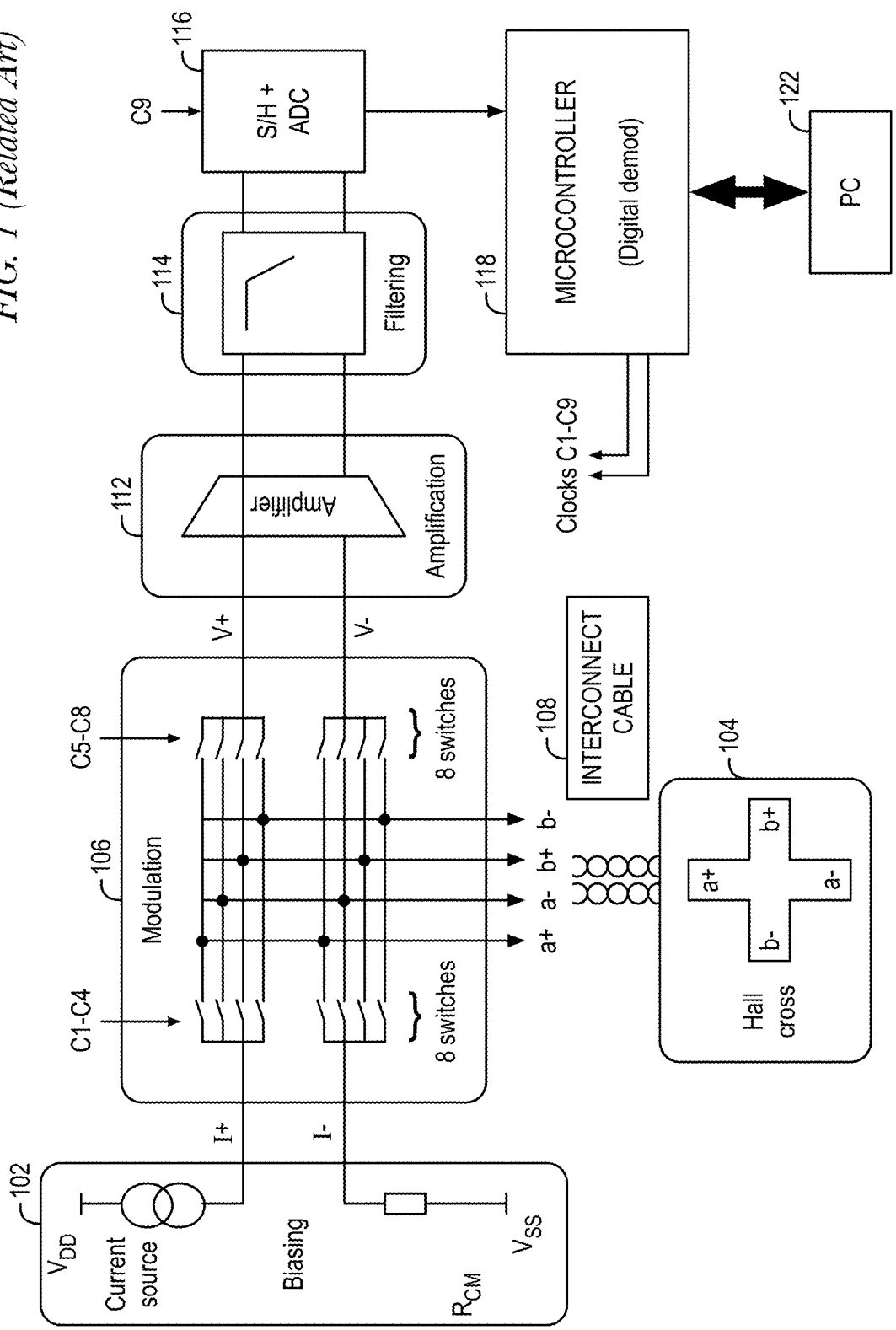
FIG. 1 is a related art block diagram illustrating a system that includes a Hall sensor circuit and a spinning current modulation technique (SCMT) apparatus.

In Fig. 1, Sheet 1 of 8, insert Main Designator -- 100 --.

In the Specification

In Column 1, Line 59, delete "Hall sensor 104" and insert -- Hall plate 104 --, therefor.

Signed and Sealed this
Eighteenth Day of August, 2020

Andrei Iancu
*Director of the United States Patent and Trademark Office*